(12) United States Patent
Matsuta et al.

(10) Patent No.: US 6,389,680 B1
(45) Date of Patent: May 21, 2002

(54) METHOD OF MANUFACTURING ELECTRONIC COMPONENT

(75) Inventors: Katsuji Matsuta, Sabae; Masahiko Kawaguchi, Takefu, both of (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/035,556

(22) Filed: Mar. 5, 1998

(30) Foreign Application Priority Data

Mar. 19, 1997 (JP) .............................. 9-086051

(51) Int. Cl.[7] ................................. H01F 7/06
(52) U.S. Cl. .................... 29/602.1; 29/25.42; 29/25.35; 361/309
(58) Field of Search .............................. 29/602.1, 25.42, 29/25.62; 156/89, 250, 630, 309; 361/328, 309, 306.3, 308.1, 310, 321, 321.1

(56) References Cited

U.S. PATENT DOCUMENTS

| | | | | |
|---|---|---|---|---|
| 4,336,320 A | * | 6/1982 | Cummings et al. | 430/198 |
| 4,931,901 A | * | 6/1990 | Heron, Jr. | 361/321 |
| 4,953,273 A | * | 9/1990 | Insetta et al. | 29/25.42 |
| 5,197,170 A | * | 3/1993 | Senda et al. | 29/25.42 |
| 5,440,794 A | * | 8/1995 | Kaeriyama et al. | 29/25.42 |

FOREIGN PATENT DOCUMENTS

| | | | |
|---|---|---|---|
| JP | 58-116204 | 8/1983 | |
| JP | 405304030 | * 11/1993 | 29/602.1 |
| JP | 7-66076 | 10/1995 | |

* cited by examiner

*Primary Examiner*—Peter Vo
*Assistant Examiner*—Sean Smith
(74) *Attorney, Agent, or Firm*—Keating & Bennett, LLP

(57) ABSTRACT

A method of manufacturing an electronic component secures sufficient area such that an element of the electronic component can be formed on the surface of a mother substrate while preventing debris from an insulating film from remaining on the element. According the method, individual elements are cut out from the mother substrate by cutting the mother substrate along cut lines A and B by using a dicing process wherein a protecting film is not located only at portions of the surface of the mother substrate where cut lines A and B intersect with each other and the surface of the mother substrate is exposed only at the intersection portions.

20 Claims, 6 Drawing Sheets

METHOD OF MANUFACTURING ELECTRONIC COMPONENT

BACKGROUND OF THE INVENTION

1. Field of the Invention

The present invention relates to a method of manufacturing an electronic component, particularly to a method of manufacturing an electronic component having a structure in which a cover material, such as an insulating film or a protective film, is disposed to cover an entire surface of the electronic component except for locations at which cutting lines intersect.

2. Description of Prior Art

For example, as shown in FIG. 5, a chip type coil component includes a thin film coil pattern (conductor pattern) which is disposed on a surface of a substrate. The method of manufacturing such a chip type coil component includes a step of cutting out individual elements 54 by cutting a mother substrate 53 on which a plurality of thin film coil patterns 51 are arranged. As can be seen in FIG. 5, the surfaces of the thin film coil patterns 51 are covered with an insulating/protecting film (referred to as a "cover material") 52 at predetermined positions.

Further, a resin material including, for example, polyimide or the like is used for the cover material 52 because of its desired surface smoothness, insulation performance, heat resistance and aptitude for micro-machining required because of the decreasing size of such components.

Further, a conventional method of cutting out the individual elements 54 by cutting the mother substrate 53 at predetermined positions includes a step of breaking the mother substrate 53 by using a scriber. However, this method requires a process of cutting and separating each element 54 from the mother substrate 53 by using a cleavage operation. With such a method, the mother substrate 53 cannot be cut when the insulating/protecting film 52 covers scribe lines. Therefore, cut margins 55 shown in FIG. 5 must be provided at the periphery of each of the insulating/protecting films 52.

Further, considering the machining accuracy of the scribing and breaking process involved in this conventional method, a width of the cut margin 55 provided at the periphery of the insulating/protecting film 52 needs to be at least about 100 $\mu$m and each insulating/protecting film 52 needs to be located at a region about 50 $\mu$m from respective surrounding peripheral portions of each individual element 54, such as a thin film coil pattern.

Further, considering the forming accuracy of the insulating/protecting films 52, the thin film coil pattern (conductor pattern) 51 needs to be formed about 30 to 50 $\mu$m from respective surrounding peripheral portions of the insulating/protecting film 52.

When it is necessary to reduce a size of an electronic component of a chip type, particularly, a chip type coil component including a conductive pattern comprising a thin film coil pattern or the like located on the surface of a substrate, is important to have a sufficient width and size of an area for forming a conductive pattern in order to maintain and improve the function and characteristics of the component. However, when a mother substrate is cut by the scribing and breaking process as described above, it is difficult to secure an area on the mother substrate that is sufficient for forming a conductive pattern because of problems with the manufacturing accuracy of the scribing and breaking process and accuracy of forming the insulating/protecting film. Thus, it is not possible to achieve the desired reduction in size of the electronic component.

Further, other conventional methods of cutting out individual elements by cutting the mother substrate at predetermined positions involve a dicing process using a dicing blade for cutting the mother substrate. According to such a dicing process, the manufacturing accuracy is improved and the insulating/protecting film can simultaneously be cut with the substrate. Therefore, the cut margin 55 required in the method shown in FIG. 5 is not needed. Thus, as shown in FIG. 6, the insulating/protecting film 52 can be formed on the entire surface of the mother substrate 53 and there is no requirement to leave exposed portions of the substrate or to form cut margins 55 required in the process shown in FIG. 5. Accordingly, this conventional method using a dicing process provides an advantage over the scribing and breaking process or the like shown in FIG. 5, because in the conventional method shown in FIG. 6, the conductor patterns 51 can extend up to the outer peripheral portions of a chip and an area which can be used for forming the chip can be reliably and accurately provided.

According to the conventional dicing process, the mother substrate 53 is cut along cut lines A and B (FIG. 6) which intersect each other perpendicularly. In that case, for example, a first cutting operation is initially performed along the cut lines A and a second cutting operation is performed thereafter along the cut lines B of a sub-mother substrate 53a having a strip-like shape to thereby cut out the individual elements 54 from the substrate 53.

Further, in performing the second cutting operation, the dicing blade is always brought into contact with an end of the substrate (end portion of the sub-mother substrate 53a which is formed to have the strip-like shape by the first cutting operation). At this moment, as shown by FIG. 7, the machining is performed by first bringing the insulating/protecting film 52 into contact with the dicing blade 57 at an end portion of the sub-mother substrate 53a. The insulating/protecting film 52 is sing softer and more deformable than a material used for forming the substrate. A very small chip or breakage of the insulating/protecting film 52 is liable to occur at the end portion of the sub-mother substrate 53a during dicing because of the action of the dicing blade 57 on the substrate 53a. Therefore, debris 56 comprising a part of the insulating/protecting film 52 may be caused at the end of the substrate 53a by stretching or removal of the insulating/protecting film 52 or may remain in the individual elements 54 of the electronic component.

A product where debris from the insulating/protecting film remains on the component as described above, causes a failure in the functioning and reliability of the electronic component and the finished product incorporating the electronic component.

SUMMARY OF THE INVENTION

To overcome the problems described above, the preferred embodiments of the present invention provide a method of manufacturing an electronic component which is arranged to increase an area on a surface of a mother substrate which is available for forming an element of the electronic component while preventing debris from an insulating/protecting film from remaining on the element or the electronic component.

According to one preferred embodiment of the present invention, there is provided a method of manufacturing an electronic component which includes the steps of providing a mother substrate; forming a plurality of elements of the electronic component on the mother substrate; forming a cover material, such as an insulating film or a protecting film, on an entire surface of the mother substrate except for locations where cutting lines intersect such that portions of the substrate are exposed only at the locations where the cutting lines intersect; cutting out a plurality of the elements of the electronic component from the mother substrate by cutting the mother substrate along the intersecting cut lines; wherein the mother substrate is cut along the cut lines by using a dicing process and the dicing process begins at the exposed portions of the substrate where cutting lines intersect such that only the mother substrate is cut initially and then continues such that the mother substrate and the cover material are cut together.

By cutting the mother substrate where the cover material is not located at portions of intersecting cut lines such that the surface of the mother substrate is exposed at the intersection portions, several advantages are provided. When a first cutting operation is performed initially along cut lines A and thereafter, and a second cutting operation is performed along cut lines B with respect to a sub-mother substrate 3a having a strip-like shape as shown by FIG. 1, end portions (intersection portions 5) of the mother substrate 3 and sub-mother substrate 3a are the first portions of the mother substrate 3 and sub-mother substrate 3a contacted by a dicing blade 6. Because these portions of the mother substrate 3 and sub-mother substrate are not covered with a cover material (insulating/protecting film) 2, the cover material 2 is not pulled or deformed by the dicing blade G. After a portion (exposed portion 5a) of the mother substrate 3 and sub-mother substrate 3a that is not covered with the cover material 2 has been cut as shown by FIG. 2(a), successively, as shown by FIG. 2(b), the cover material 2 and the mother substrate and the cover material and the sub-mother substrate 3a are simultaneously cut (machined). Therefore, individual elements of the electronic component can be accurately and reliably cut out by firmly cutting the mother substrate without causing or leaving debris of the cover material.

According to the preferred embodiments of the present invention, not only the intersection portions 5 of the cut lines A and B but the surface of the mother substrate 3 can be exposed also at end portions of the cut lines A which are to be cut in the first cutting step.

With the above described method, it is possible to form a cover material over an entire surface of a mother substrate, except for locations at which the cutting lines intersect. Thus, it is not required to form cut margins 55 as shown in FIG. 5 or have the required exact separation of the elements 51 from other elements 51 and from cut margins 55. Thus, in the preferred embodiments of the present invention, an entire area of each of the cut lines and corresponding location on the mother substrate are covered by a cover material except only for portions of intersection with other cut lines. Also, there is no need for size reduction of the elements, such as thin film coil patterns, in the preferred embodiments of the present invention, as is required in the method shown in FIG. 5.

Further, the method according to the preferred embodiments of the present invention reliably and accurately avoid the problems shown in FIG. 7 of debris being created during the dicing process, while ensuring a sufficiently large size of the elements of the electronic component.

Also according to the preferred embodiments of the present invention, the dicing process represents a concept signifying a method of gradually cutting the mother substrate by a machining process including bringing a rotating blade (dicing blade) into contact with the mother substrate. It is important to note that no particular restriction is imposed on the kinds of the dicing blade or cutting blade or process used for the first and second cutting steps.

Further, the method of manufacturing an electronic component according to preferred embodiments of the present invention includes a step wherein a conductor pattern is arranged on the surface of the mother substrate and the surface of the mother substrate where the conductor pattern is arranged is covered with the cover material, such as an insulating film and/or a protective film.

When the preferred embodiments of the present invention are applied to a method of manufacturing an electronic component (for example, a chip type coil part where a coil pattern is arranged on the surface) which requires a step of cutting a mother substrate where a conductor pattern (for example, coil pattern) is arranged on the surface and the surface arranged with the conductor pattern is covered with the over material (for example, insulating/protecting film), an increased area of sufficient size that is available for use for forming elements, such as a thin film coil pattern, on the surface of the mother substrate can be reliably and accurately provided and an electronic component having a desired function can efficiently be manufactured.

Further, the preferred embodiments of the present invention is naturally applicable to an electronic component where an electrode is arranged at an inside portion of the substrate.

Further, a method of manufacturing an electronic component according to preferred embodiments of the present invention includes the step of forming a cover material comprising an insulating film or a protecting film of a resin group on selected portions of the surface of the substrate.

Although there are cases where a material of an inorganic group such as glass group or the like is used as cover material, a cover material of a resin group is preferably used in the preferred embodiments of the present invention. The cover material of a resin group is softer and more deformable than the material for constituting the mother substrate and debris of the cover material is liable to occur in the step of cutting the mother substrate. However, the occurrence of debris of the cover material of a resin group can efficiently be prevented by applying the steps of preferred embodiments of the present invention.

Further, the method of manufacturing an electronic component according to preferred embodiments of the present invention includes a step wherein exposed portions of the mother substrate at the intersection portions of the cut lines are arranged and adapted to function as cut markers for determining cut positions.

When the exposed portion of the mother substrate is utilized as the cut marker for determining the cut position, a step of separately arranging a positioning marker is eliminated and the mother substrate can efficiently be cut reliably and accurately at predetermined positions without increasing the cost.

Figure 1A:
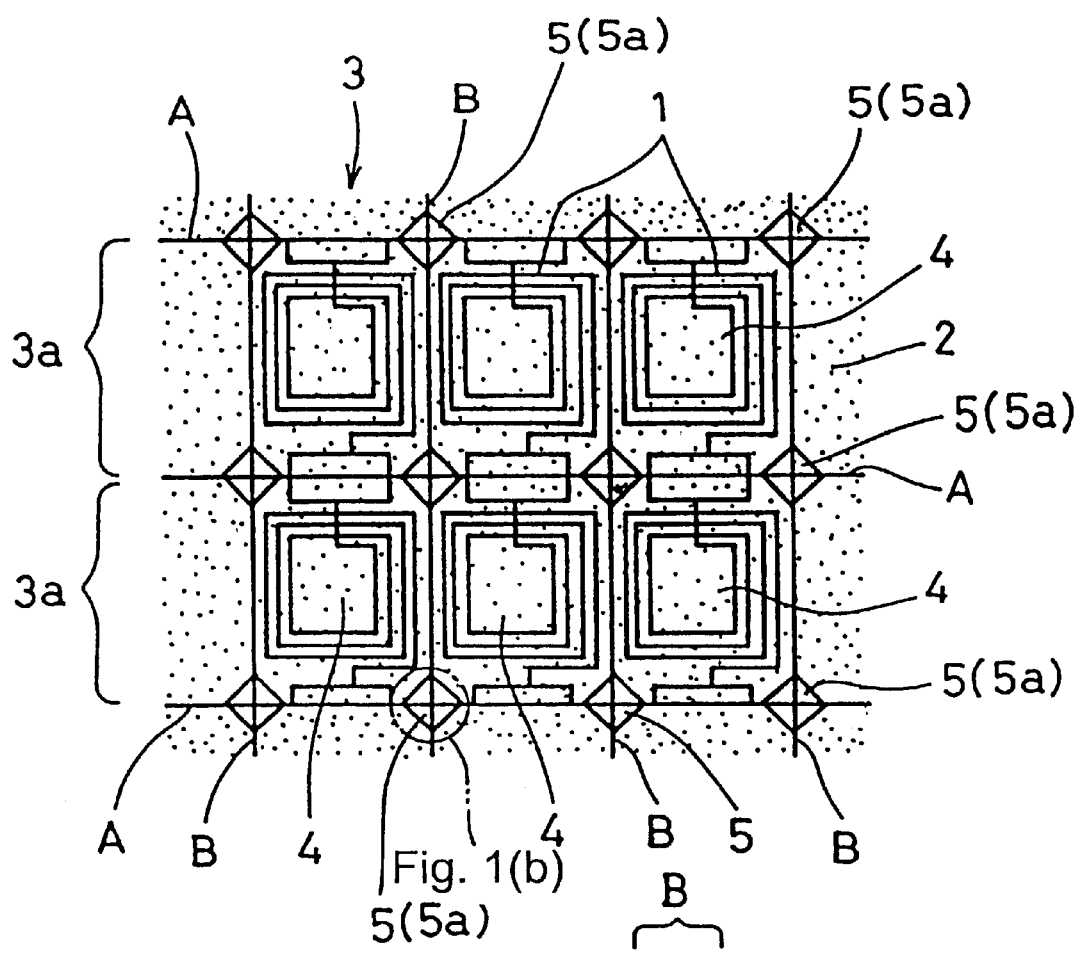
FIG. 1(a) is a plain view showing a mother substrate formed by a method of manufacturing an electronic component according to a preferred embodiment of the present invention.
Figure 1B:
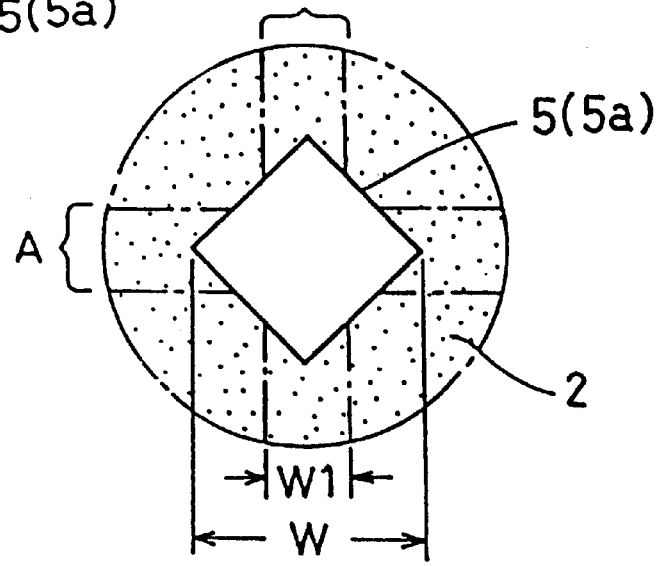
FIG. 1(b) is a plain view showing a portion 1(b) of the mother substrate as illustrated in FIG. 1 (a).

First, as shown in FIGS. 1(a) and 1(b), after forming a plurality of the thin film coil patterns 1 on the ceramic substrate (mother substrate) 3, the insulating/protecting film 2 for protecting the thin film coil pattern 1 is formed on the surface of the mother substrate 3 at locations where the thin film coil patterns 1 have been formed. The insulating/protecting film 2 is formed so as to cover an entire surface of the mother substrate 3 except only for locations or portions 5 where cut lines A and B intersect with each other as seen in FIGS. 1(a) and 1(b). As a result, the surface of the mother substrate 3 is exposed at the intersection portions 5.

Figure 2A:
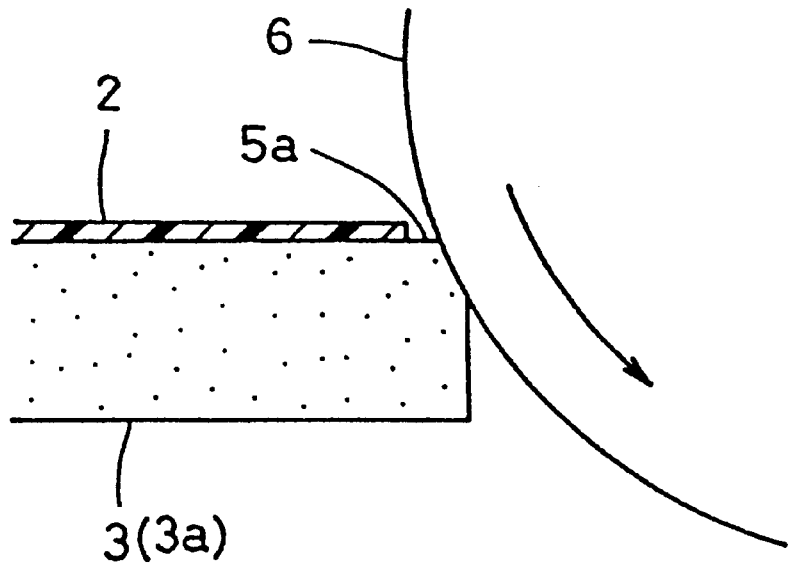
Figure 2B:
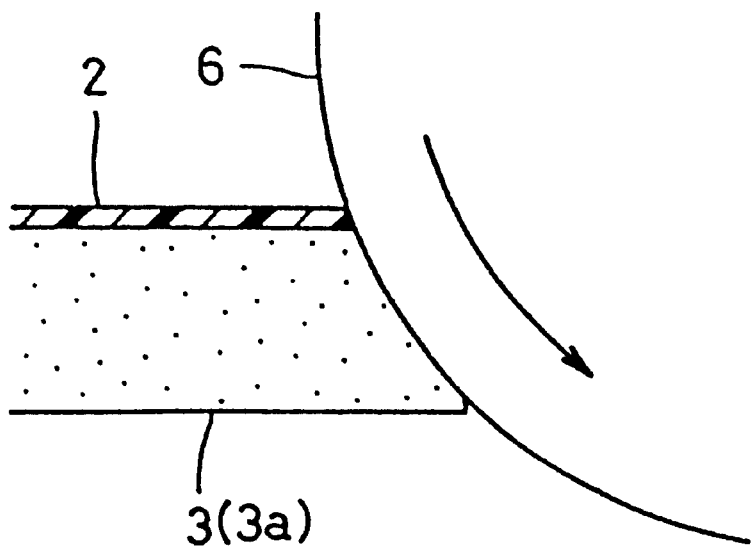
Figure 3:
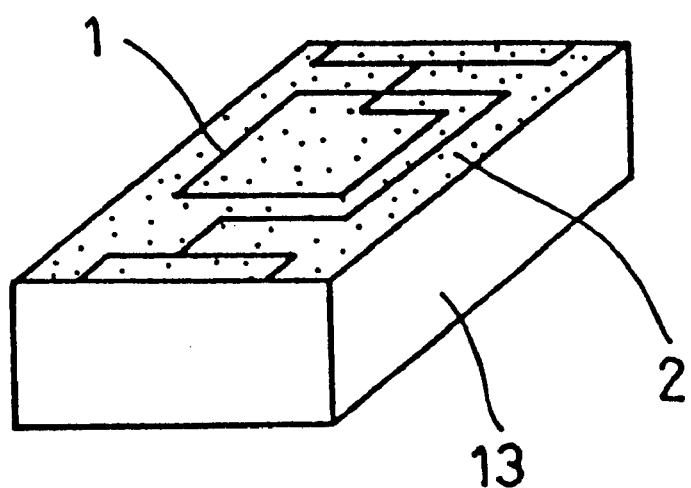
Figure 4A:
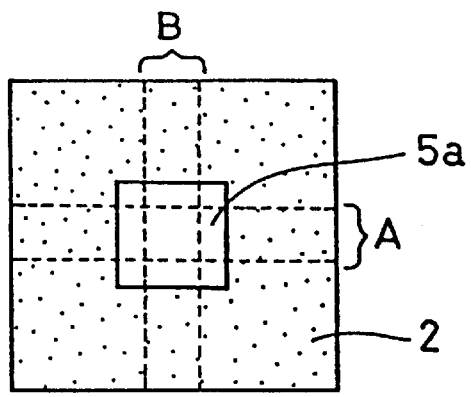
Figure 4B:
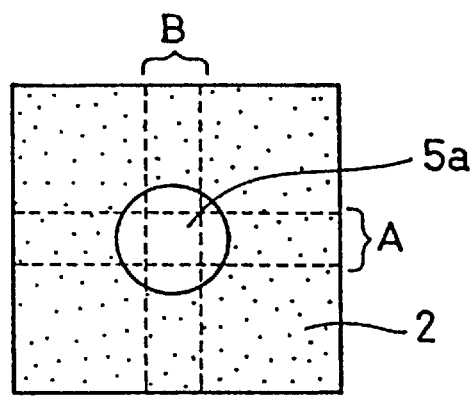
Figure 4C:
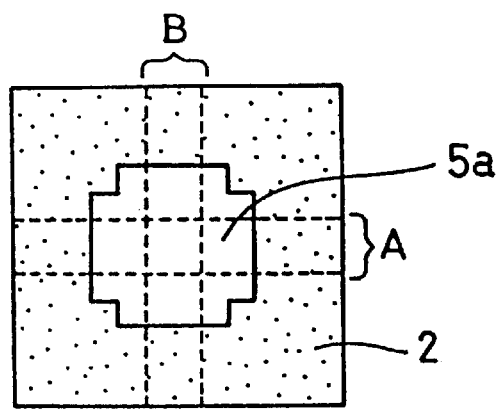
Figure 4D:
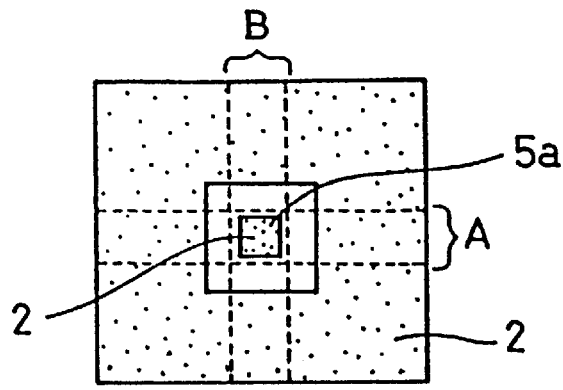
Figure 5:
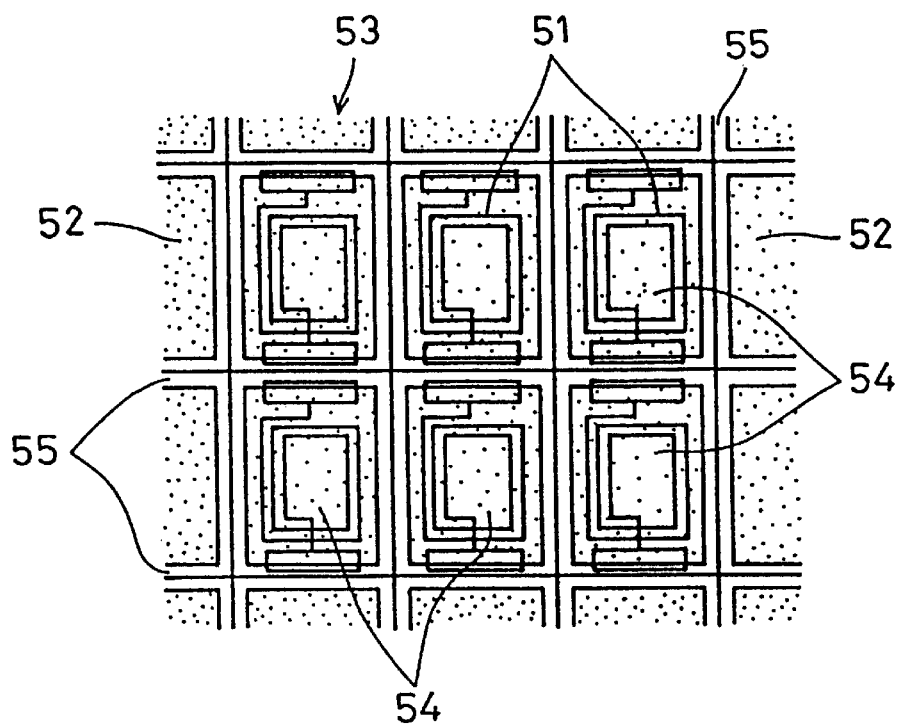
Figure 6:
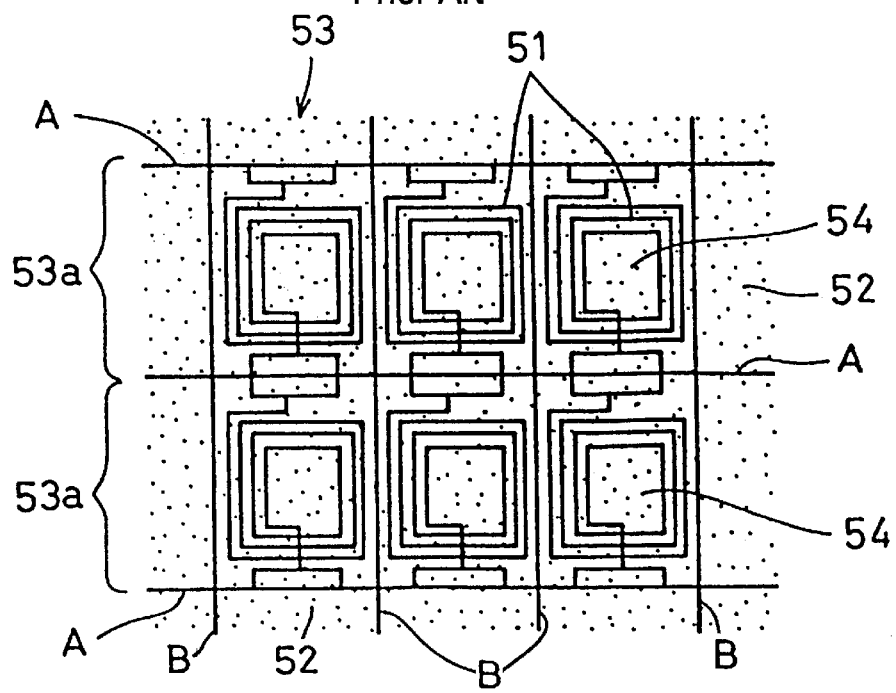
Figure 7:
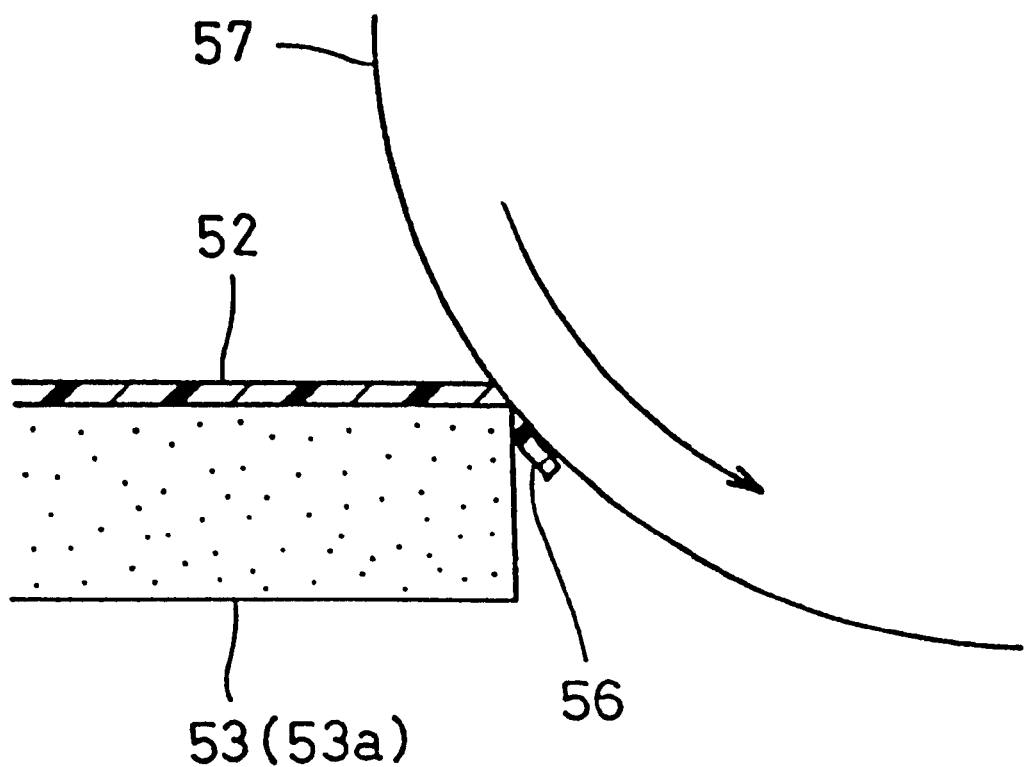

FIG. 2(a) is a view illustrating a state of cutting a mother substrate according to a step in the method of manufacturing an electronic component according to a preferred embodiment of the present invention in which a dicing blade is brought into contact with an end portion of the mother substrate;

FIG. 2(b) is a view illustrating a state of cutting a mother substrate according to a step in the method of manufacturing an electronic component according to a preferred embodiment of the present invention in which the mother substrate and an insulating/protecting film are simultaneously cut;

FIG. 3 is a perspective view showing a finished electronic component made by a method according to a preferred embodiment of the present invention;

FIG. 4(a) is a view illustrating an example of a pattern with respect to exposed portions of a mother substrate according to a preferred embodiment of the present invention;

FIG. 4(b) is a view illustrating another example of a pattern with respect to exposed portions of a mother substrate according to a preferred embodiment of the present invention;

FIG. 4(c) is a view illustrating another example of a pattern with respect to exposed portions of a mother substrate according to a preferred embodiment of the present invention;

FIG. 4(d) is a view illustrating another example of a pattern with respect to exposed portions of a mother substrate according to a preferred embodiment of the present invention;

FIG. 5 is a view showing a mother substrate formed by a conventional method of manufacturing an electronic component;

FIG. 6 is a view showing a mother substrate formed by another conventional method of manufacturing an electronic component; and FIG. 7 is a view showing a state where a mother substrate is cut in a step of a conventional method of manufacturing an electronic component.

DETAILED DESCRIPTION OF PREFERRED EMBODIMENTS

A further detailed explanation will be given of the features of the present invention by describing preferred embodiments as follows.

An explanation will be given of preferred embodiments with an example of manufacturing a chip type coil part having a structure in which, as shown by FIG. 3, a thin film coil pattern (conductor pattern) 1 is arranged on the surface of a ceramic substrate 13 and the surface of the ceramic substrate 13 arranged with the thin film coil pattern 1 is covered with an insulating/protecting film 2.

First, as shown in FIG. 1, after forming a plurality of the thin film coil patterns 1 on the ceramic substrate (mother substrate) 3, the insulating/protecting film 2 for protecting the thin film coil patterns 1 is formed on the surface of the mother substrate 3 at locations where the thin film coil patterns 1 have been formed. The insulating/protecting film 2 is formed so as to cover an entire surface of the mother substrate 3 except only for locations or portions 5 where cut lines A and B intersect with each other as seen in FIG. 1. As a result, the surface of the mother substrate 3 is exposed at the intersection portions 5.

Further, certain portions of the intersection portions 5 of the mother substrate 3 where the mother substrate 3 is exposed, hereinafter referred to as exposed portions 5a, preferably have a shape of a rhombus formed by inclining a quadrate by about 45 degrees relative to horizontal and vertical directions of the orthogonally intersected cut lines A and B. Further, a width W of the portions 5a which is preferably substantially orthogonal to the cut lines A or B is preferably formed to be larger than a width (machining width) W1 defined by the cutting lines when the mother substrate 3 is cut by a dicing blade 6 (FIGS. 2(a) and 2(b)). By making the width W of the exposed portion 5a larger than the machining width W1, the cutting process eliminates and avoids the problems of the prior art in which the dicing blade is brought into contact with the insulating/protecting film 2 at the end of the substrate resulting in the dicing blade pulling the insulating/protecting film 2 and generating debris from the insulating/protecting film 2.

Further, in forming the insulating/protecting film 2, for example, a photosensitive polyimide resin is preferably used and a photolithography process is used in the forming operation by which the insulating/protecting film 2 can easily be formed with certainty over the entire surface of the mother substrate 3 except for the intersection portions 5 defined by intersecting of the cut lines A and B. Further, the method of forming the insulating/protecting film 2 is not limited to photolithography but other methods of forming the film 2 such as screen printing or the like can be used.

Further, the material for constituting the insulating/protecting film 2 is not limited to polyimide resin but various materials having necessary insulation performance, weather resistance or the like can be used.

Next, the mother substrate 3 where the thin film coil pattern 1 and the insulating/protecting film 2 have been formed as described above, is divided in a strip-like shape by cutting the mother substrate 3 along the cut lines A by using the dicing process. Then, a divided mother substrate or sub-mother substrate 3a having the strip-like shape is cut along the cut lines B.

According to the method of preferred embodiments, the exposed portion 5a of the mother substrate 3 is arranged to function as a marker (cut marker) by which the cutting position is determined to ensure accurate dicing of the mother substrate 3.

When the first cutting operation is initially performed along the cut lines A relative to the mother substrate covered with cover material at portions other than the intersection portions 5 of the cut lines A and B and the second cutting operation is performed along the cut lines B relative to the sub-mother substrate 3a having the strip-like shape as in the case of the preferred embodiment, since the end of the substrate (that is, the exposed portion 5a) with which the dicing blade 6 is brought into contact is not covered with the insulating/protecting film 2, the insulating/protecting film 2 is not pulled or deformed by the dicing blade 6 at the end portion of the sub-mother substrate 3a. After the portion (exposed portion 5a) that is not covered with the insulating/ protecting film 2 of the sub-mother substrate 3a has been cut as shown by FIG. 2(a), the insulating/protecting film 2 and the sub-mother substrate 3a are cut (machined) as shown by FIG. 2(b). Therefore, the insulating/protecting film 2 is firmly cut (machined) along with the sub-mother substrate 3a in a strip-like shape without being pulled or deformed. Therefore, the individual elements 4 can accurately be cut out with no debris from the cover material being created or left on any of the elements or the electronic component.

Further, FIGS. 4(a), 4(b), 4(c) and 4(d) are views showing other examples of patterns of the exposed portion 5a of the mother substrate 3. As shown by FIGS. 4(a), 4(b), 4(c) and 4(d), the exposed portion Sa can be provided with various shapes of, for example, a square such as a quadrate or a rectangle (FIG. 4(a)), a circle (FIG. 4(b)), a square having recessed four corners (FIG. 4(c)), a square ring where the insulating/protecting film 2 is located at the central portion (FIG. 4(d)) and the like and can be provided with other shapes.

Further, according to the preferred embodiments, an explanation has been given of an example of a case where a chip type coil component is manufactured. However, the present invention is not limited to a chip type coil component but is applicable to various electronic components which have a cover material such as an insulating/protecting film or the like on the surfaces thereof.

Further, although according to the above-described embodiments, an explanation has been given of a case where the insulating/protecting film is formed only on one surface of the mother substrate, the present invention is applicable to a case where the insulating/protecting films are formed on both surfaces thereof.

The present invention is not limited to the above-described preferred embodiments in view of still other points but can be applied with various application or modification within the scope of the gist of the present invention.

As mentioned above, according to the method of manufacturing an electronic component of the present invention, the cover material is not formed on the mother substrate at only the intersection portions of the cut lines and the cutting operation is performed in a state where a first portion of the surface of the mother substrate which is cut is exposed and not covered by the cover material. Therefore, the individual elements can reliably be cut out from the mother substrate while preventing the cover material from being pulled and extended at the end of the substrate and preventing occurrence of debris from the cover material caused by extension or escape of the cover material.

Further, when preferred embodiments of the present invention are applied to manufacturing an electronic component (for example, a chip type coil part where a coil pattern is arranged on the surface) which requires a step of cutting a mother substrate in which a conductor pattern (for example, coil pattern) is arranged on the surface and the surface arranged with the conductor pattern is covered with cover material (for example, insulating/protecting film), an area of the surface of the mother substrate that is used to form an element can be reliably increased and an electronic component provided with desired function can efficiently be manufactured.

Further, although there are cases where a material of an inorganic group such as glass group or the like is used as a cover material, a cover material of a resin group which is softer and more deformable than the material for constituting a mother substrate is frequently used and in such a case, debris formed from the cover material is liable to occur in the step of cutting the mother substrate. However, the occurrence of debris from the cover material of a resin group can efficiently be prevented by applying the steps of preferred embodiments of the present invention.

Further, when the exposed portion of the mother substrate is utilized as a cut marker for determining the cut position, a step of separately arranging a positioning marker is eliminated and the mother substrate can efficiently be cut with certainty at predetermined positions.

While the invention has been particularly shown and described with reference to preferred embodiments thereto, it will be understood by those skilled in the art that the foregoing and other changes in form and details may be made therein without departing from the spirit of the invention.

What is claimed is:

1. A method of manufacturing an electronic component comprising the steps of:

providing a mother substrate;

forming a plurality of elements of the electronic component on the mother substrate;

forming an insulating/protecting film made of a photosensitive polyimide resin via a photolithographic process on an entire surface of the mother substrate except for polygonal-shaped areas surrounding each point where vertically and horizontally extending cut lines intersect each other such that portions of the mother substrate are exposed only at the polygonal-shaped areas surrounding each point where the cut lines intersect and such that the vertically and horizontally extending cut lines are covered by the cover material at all portions except portions located within the polygonal-shaped areas surrounding each point where the vertically extending cut lines intersect with the horizontally extending cut lines; and cutting out the plurality of the elements of the electronic component from the mother substrate by cutting the mother substrate along the intersecting cut lines; wherein the mother substrate is cut along the cut lines by using a dicing process and the dicing process begins at the exposed portions of the substrate where the horizontally extending cut lines intersect the vertically extending cut lines such that only the mother substrate is cut initially and then the cutting process continues such that the mother substrate and the cover material are cut together.

2. The method according to claim 1, wherein each of the plurality of elements of the electronic component comprises a conductor pattern which is arranged on the surface of the mother substrate and the conductor patterns are covered with the insulating/protecting film.

3. The method according to claim 1, wherein the cover material comprises at least one of an insulating film and a protecting film of a resin group.

4. The method according to claim 1, wherein the exposed portions of the mother substrate are cut markers for determining cut positions.

5. The method according to claim 1, wherein each of the exposed portions of the mother substrate has a shape that is substantially rhombus.

6. The method according to claim 1, wherein a width of each of the exposed portions of the mother substrate is greater than a machining width defined by a distance between adjacent ones of the cut lines.

7. The method according to claim 1, wherein each of the exposed portions of the mother substrate has a shape that is substantially rhombus and the rhombus is arranged by inclining a quadrate at an angle of about 45 degrees relative to the cut lines.

8. The method according to claim 1, wherein the step of forming a cover material on an entire surface of the mother substrate except for locations where cut lines intersect each other includes the step of using a photolithography process to form the cover material on the entire surface of the mother substrate except for locations where cut lines intersect each other.

9. The method according to claim 1, wherein the step of forming a cover material on an entire surface of the mother substrate except for locations where cut lines intersect each other includes the step of using a screen printing process to form the cover material on the entire surface of the mother substrate except for locations where cut lines intersect each other.

10. The method according to claim 1, wherein the step of cutting out a plurality of the elements of the electronic component from the mother substrate by cutting the mother substrate along the intersecting cut lines includes a first cutting step in which the mother substrate is cut in a first direction along a first group of the cut lines so as to form a plurality of sub-mother substrates each having a strip shape and a second cutting step in which each of the sub-mother substrates is cut in a second direction which is substantially orthogonal to the first direction along a remaining group of the cut lines, and in each of the first and second cutting steps, the mother substrate and the sub-mother substrates alone are cut initially and then as the first and second cutting steps continue respectively, the mother substrate and the insulating/protecting film and the sub-mother substrates and the insulating/protecting film are cut together.

11. A method of manufacturing an electronic component comprising the steps of:

forming a plurality of elements of the electronic component on a mother substrate; and forming an insulating/protecting film made of a photosensitive polyimide resin via a photolithographic process on an entire surface of the mother substrate except for polygonal-shaped areas surrounding each point where vertically and horizontally extending cut lines intersect each other such that portions of the mother substrate are exposed only at the polygonal-shaped areas surrounding each point where the cut lines intersect and such that the vertically extending cut lines and the horizontally extending cut lines are covered by the cover material along the lengths thereof except at portions located within the polygonal-shaped areas surrounding each point where the vertically extending cut lines intersect the horizontally extending cut lines.

12. The method of claim 11, further comprising the steps of cutting out a plurality of the elements of the electronic component from the mother substrate by cutting the mother substrate along the intersecting cut lines and beginning the cutting process along each of the cut lines at the exposed portions of the mother substrate.

13. The method of claim 11, further comprising the steps of cutting the mother substrate along the cut lines by using a dicing process and the dicing process begins at the exposed portions of the substrate such that only the mother substrate is cut initially and then the cutting process continues such that the mother substrate and the insulating/protecting film are cut together.

14. The method of claim 11, wherein each of the plurality of elements of the electronic component comprises a conductor pattern which is arranged on the surface of the mother substrate and the conductor pattern is covered with the insulating/protecting film.

15. The method according to claim 11, wherein the cover material comprises at least one of an insulating film and a protecting film of a resin group.

16. The method according to claim 11, wherein the exposed portions of the mother substrate are cut markers for determining cut positions.

17. The method according to claim 11, wherein each of the exposed portions of the mother substrate has a shape that is substantially rhombus.

18. The method according to claim 11, wherein a width of each of the exposed portions of the mother substrate is greater than a machining width defined by a distance between adjacent ones of the cut lines.

19. The method according to claim 11, wherein each of the exposed portions of the mother substrate has a shape that is substantially rhombus and the rhombus is arranged by inclining a quadrate at an angle of about 45 degrees relative to the cut lines.

20. The method according to claim 11, wherein the step of cutting out a plurality of the elements of the electronic component from the mother substrate by cutting the mother substrate along the intersecting cut lines including a first cutting step in which the mother substrate is cut in a first direction along a first group of the cut lines so as to form a plurality of sub-mother substrates each having a strip shape and a second cutting step in which each of the sub-mother substrates is cut in a second direction which is substantially orthogonal to the first direction along a remaining group of the cut lines, and in each of the first and second cutting steps, the mother substrate and the sub-mother substrates alone are cut initially and then as the first and second cutting steps continue respectively, the mother substrate and the insulating/protecting film and the sub-mother substrates and the insulating/protecting film are cut together.

* * * * *